(12) United States Patent
Miller et al.

(10) Patent No.: US 8,818,617 B2
(45) Date of Patent: Aug. 26, 2014

(54) METHOD AND APPARATUS FOR MONITORING BATTERY DRAIN AND STARTER CURRENT

(75) Inventors: Garret Miller, Owatonna, MN (US); Kurt Raichle, Owatonna, MN (US)

(73) Assignee: Bosch Automotive Service Solutions LLC, Warren, MI (US)

( * ) Notice: Subject to any disclaimer, the term of this patent is extended or adjusted under 35 U.S.C. 154(b) by 0 days.

(21) Appl. No.: 13/532,147

(22) Filed: Jun. 25, 2012

(65) Prior Publication Data

US 2012/0323435 A1 Dec. 20, 2012

Related U.S. Application Data

(62) Division of application No. 11/937,841, filed on Nov. 9, 2007, now Pat. No. 8,209,082.

(51) Int. Cl.
*G01M 17/00* (2006.01)
*G01R 31/36* (2006.01)
*G01R 19/00* (2006.01)

(52) U.S. Cl.
CPC ........ *G01R 19/0046* (2013.01); *G01R 19/0092* (2013.01); *G01R 31/3606* (2013.01)
USPC ........................................ 701/33.3; 701/34.4

(58) Field of Classification Search
USPC ....................................................... 701/33.3
See application file for complete search history.

(56) References Cited

U.S. PATENT DOCUMENTS

| | | | |
|---|---|---|---|
| 4,149,093 A | 4/1979 | D'Alessio et al. | |
| 5,438,237 A | 8/1995 | Mullins et al. | |
| 5,629,680 A * | 5/1997 | Makhija | 340/664 |
| 5,854,555 A * | 12/1998 | Sasaki | 324/539 |
| 6,424,157 B1 * | 7/2002 | Gollomp et al. | 324/430 |
| 6,477,478 B1 * | 11/2002 | Jones et al. | 702/102 |
| 6,621,271 B2 | 9/2003 | Ziegler | |
| 7,409,856 B2 | 8/2008 | Brott et al. | |
| 7,508,091 B2 | 3/2009 | Binder | |
| 2002/0111756 A1 * | 8/2002 | Modgil | 702/63 |
| 2003/0080621 A1 | 5/2003 | Kirk | |
| 2004/0119445 A1 | 6/2004 | Wakeman | |
| 2006/0043933 A1 * | 3/2006 | Latinis | 320/132 |
| 2008/0079592 A1 * | 4/2008 | Latinis | 340/636.15 |

FOREIGN PATENT DOCUMENTS

DE 3808559 A1 9/1989

\* cited by examiner

*Primary Examiner* — Shelley Chen

(74) *Attorney, Agent, or Firm* — Baker & Hostetler LLP

(57) ABSTRACT

A parasitic drain tester that measures a parasitic battery drain. A current measuring circuit includes a capacitor smoothing the current distribution within the circuit, a first interface connected to a vehicle power source and the capacitor, a second interface accommodating an outside connection for communication, a first processor connected to the second interface and the capacitor, the processor communicating with the second interface and performing analysis and calculation of the data received, and a converting unit connected to the processor, converting the signal received through the first interface from a first form to a second form. The first unit is connected to the current measuring circuit, and includes a memory storing information retrieved from the current measuring circuit through the second interface, and a second processor analyzing the information received from the current measuring circuit and providing instructions to the first processor through the second interface.

5 Claims, 6 Drawing Sheets

METHOD AND APPARATUS FOR MONITORING BATTERY DRAIN AND STARTER CURRENT

CROSS-REFERENCE TO RELATED APPLICATIONS

This application claims priority to and is a divisional of U.S. patent application entitled "Method and Apparatus for Monitoring Battery Drain and Starter Current," filed Nov. 9, 2007, having Ser. No. 11/937,841, the disclosure of which is hereby incorporated by reference in its entirety.

FIELD OF THE INVENTION

The present invention relates generally to a method and apparatus for measuring battery drain and starter current More particularly, the present invention relates to a method and apparatus to measure parasitic drain current, as well as starter motor current.

BACKGROUND OF THE INVENTION

Vehicles today use secondary batteries to power certain aspects of the vehicle operation. Different current demands are required by different controls, diagnostic equipment, etc., within a vehicle. Furthermore, certain data must be maintained for data collection or operation of the vehicle. A secondary battery is needed to maintain such recorded data or configuration information. A primary battery would be problematic in a vehicle in that because of the power demands, recharging is necessary.

Currently, there are separate devices that have a battery internally, which is used to keep the vehicle memory powered during removal of the main vehicle battery. Current devices only supply a secondary power via an internal battery to maintain vehicle memory and provide current measurement information by threshold indicators or readouts. The secondary power via an internal battery is usually also a secondary battery, but can be a primary battery depending on the load.

When a vehicle's secondary battery is drained, it can be either be at the end of its life span or the vehicle has drained the secondary battery without it being recharged. A faulty alternator may prevent the battery from being recharged, or the wiring from the alternator to the battery is faulty. Additionally, it may simply be a light left on while the vehicle is not in a recharging state. A parasitic drain in general is when an electrical device such as a vehicle is using the power from a battery, when the vehicle is not in a recharging state, e.g., when gas combustion of an engine in a vehicle powering the alternator is off.

In order to perform a parasitic drain test, one should make sure that the internal and external light emitting sources are in the off position, as that is a major drain on the battery. A general technique to test for the parasitic drain is to first remove the negative wire from the battery's negative electrode. As a general rule, when a circuit is complete or is about to be complete with the final connection, a user should only touch upon the grounded or negative electrode of an electrical power source in order to avoid the potential of shock. Grounding is usually established by connecting the negative electrode of the vehicle battery to the ground post, which connects to the body of the vehicle.

Then, a user attaches a test light between the negative battery electrode and negative battery post. Thereafter, the user must wait a certain duration for the vehicle to go into a sleep mode. If the test light is powered brightly, then there is something in the vehicle that is using too much power from the battery. Then, one must go to the fuse panel and remove the fuses to see what is the source of the power drain, thereby identifying the specific circuit that is draining the battery. Once the specific circuit is identified, then each specific device on the circuit must be checked, until the test lamp is dimly lit in order to ascertain that the battery drain is at an acceptable level. Such methods are harsh and are prone to errors and problems. The testing itself may cause further drain and is only helpful when the battery is fully recharged.

There are devices similar that sense the vehicle's current draw when the vehicle's battery is disconnected. Usually the internal battery of the device has to be high current draw etc. and is a wear item. There is also a need to log current draw (parasitic load) over a long period of time (up to an hour or more) as it takes that long for a vehicle to shut down to a low current state. There is a further need to address the problem of depleting internal batteries because power is supplied by the battery charger.

Accordingly, it is desirable to provide an apparatus and technique for correcting the problem of depleting an internal battery and to more accurately monitor the current information as it relates to the battery drain and starter current.

SUMMARY OF THE INVENTION

The foregoing needs are met, to a great extent, by the present invention, wherein in one aspect an apparatus is provided that in some embodiments provide more information of the vehicle current and avoid depleting internal batteries.

In accordance with aspect of the invention, a parasitic drain tester, includes a current measuring circuit and a first unit. The current measuring circuit includes a capacitor smoothing the current distribution within the circuit, a first interface connected to a vehicle power source being tested and the capacitor, a second interface accommodating an outside connection for communication, a first processor connected to the second interface and the capacitor, the processor communicating with the second interface and performing analysis and calculation of the data received, and a converting unit connected to the processor, converting the signal received through the first interface from a first form to a second form in order to process the signal received. The first unit is connected to the current measuring circuit, and the first unit includes a memory storing information retrieved from the current measuring circuit through the second interface, and a second processor analyzes the information received from the current measuring circuit and providing instructions to the first processor through the second interface.

The interface can also include a first interface being connected to the vehicle through a clamp on the secondary battery of the vehicle. Additionally, the first interface can be connected to a cigarette lighter or internal direct current outlet of the vehicle through an adapter. The first processor can also be a flash processor accommodating a reprogramming through software. The converting unit can integral with the first processor and be an analog to digital converter. The second connector is a molded compact flash connector with input and output communication with the first unit. The first unit can be any one of a battery service center, diagnostic tool and personal computer. The battery service center can provide a power to the circuit through the capacitor. The diagnostic tool can analyze the data from the circuit transferred through the second interface, and there can be an external power supply providing power to the circuit and the secondary battery of the vehicle.

In accordance with yet another aspect of the present invention, there are provided computer readable media having embodied thereon computer-executable instructions for execution of a current measuring method by a processor according to aspects of the invention.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Exemplary embodiments for illustration of the invention are described with reference to FIGS. 1 through 6 as follows. This invention is intended, for example, to utilize a smart battery charger as a current source to keep the vehicle memory alive, and power a device to measure the current draw with a low current sensor, and send it via a serial link to an interface on a host device. The link does not have to be a serial link but can be another type of link.

The invention can also be used to accommodate a current probe which is used to measure vehicle starter current during a test. The invention can also be expanded to measure point to point voltage. The invention will provide more information about the vehicle's current, then the existing products by automatically monitoring and recording the current at intervals for later review or analysis. The unit can also be used with a standard 10 AMP (amperes) bench battery charger and interfaced to a diagnostic tool or a PC (personal computer). As shown below, in one aspect an apparatus is provided that in some embodiments provide more information of the vehicle current and avoid depleting internal batteries.

Figure 1:
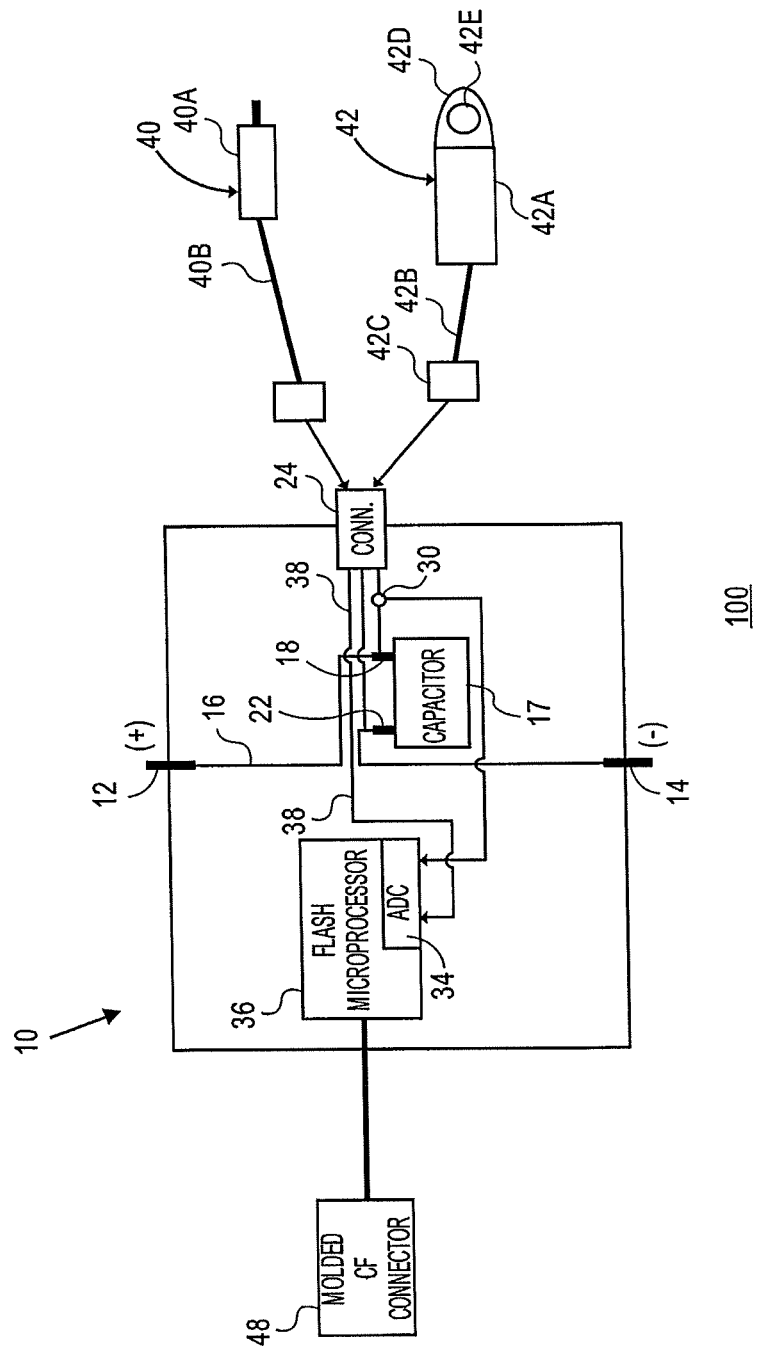
FIG. 1 is a schematic view illustrating an exemplary battery charger adapter that can implement a recovery method, apparatus and system according to embodiments and aspects of the invention.
Figure 2:
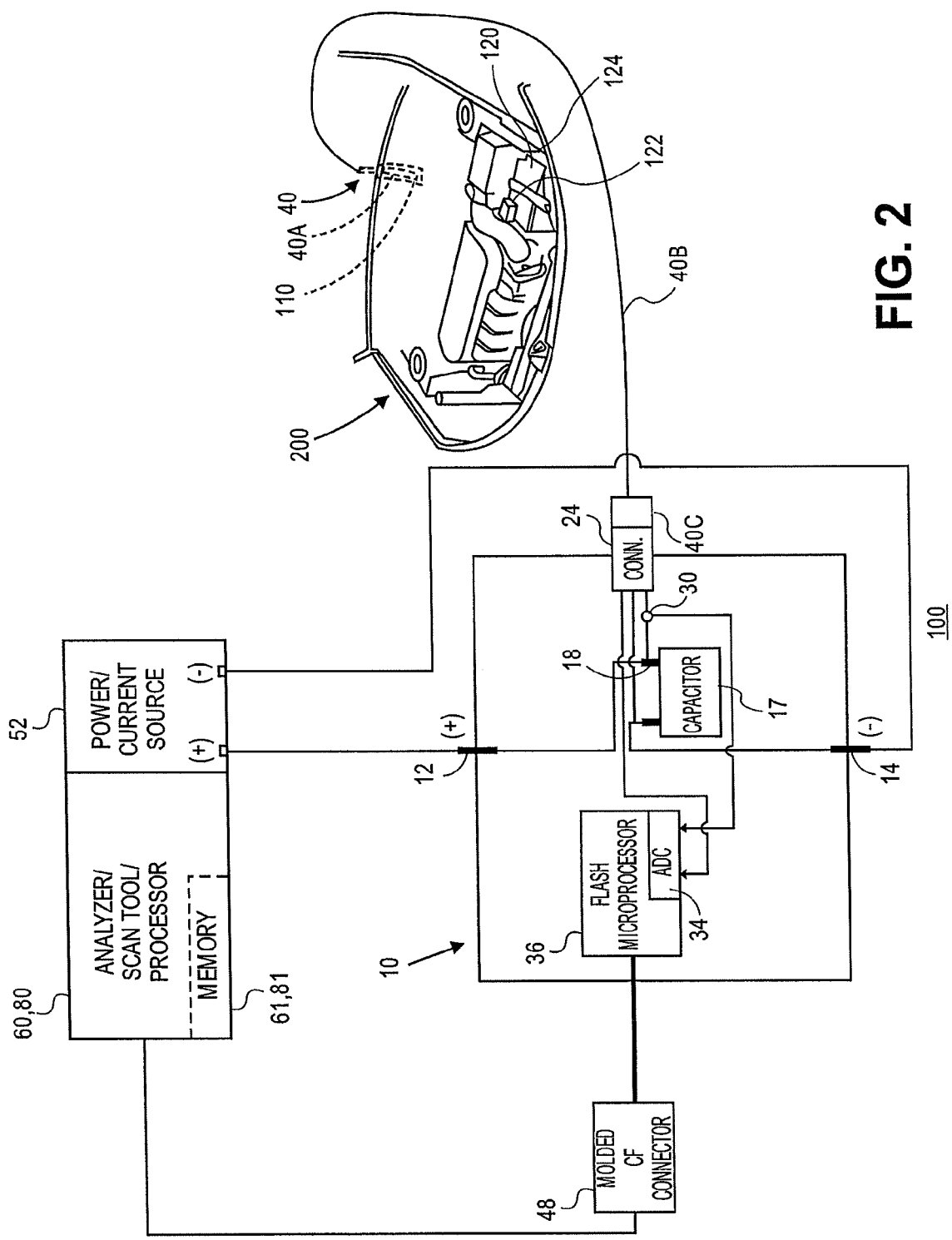
FIG. 2 is a schematic view of the battery charger adapter connected to a vehicle.
Figure 3:
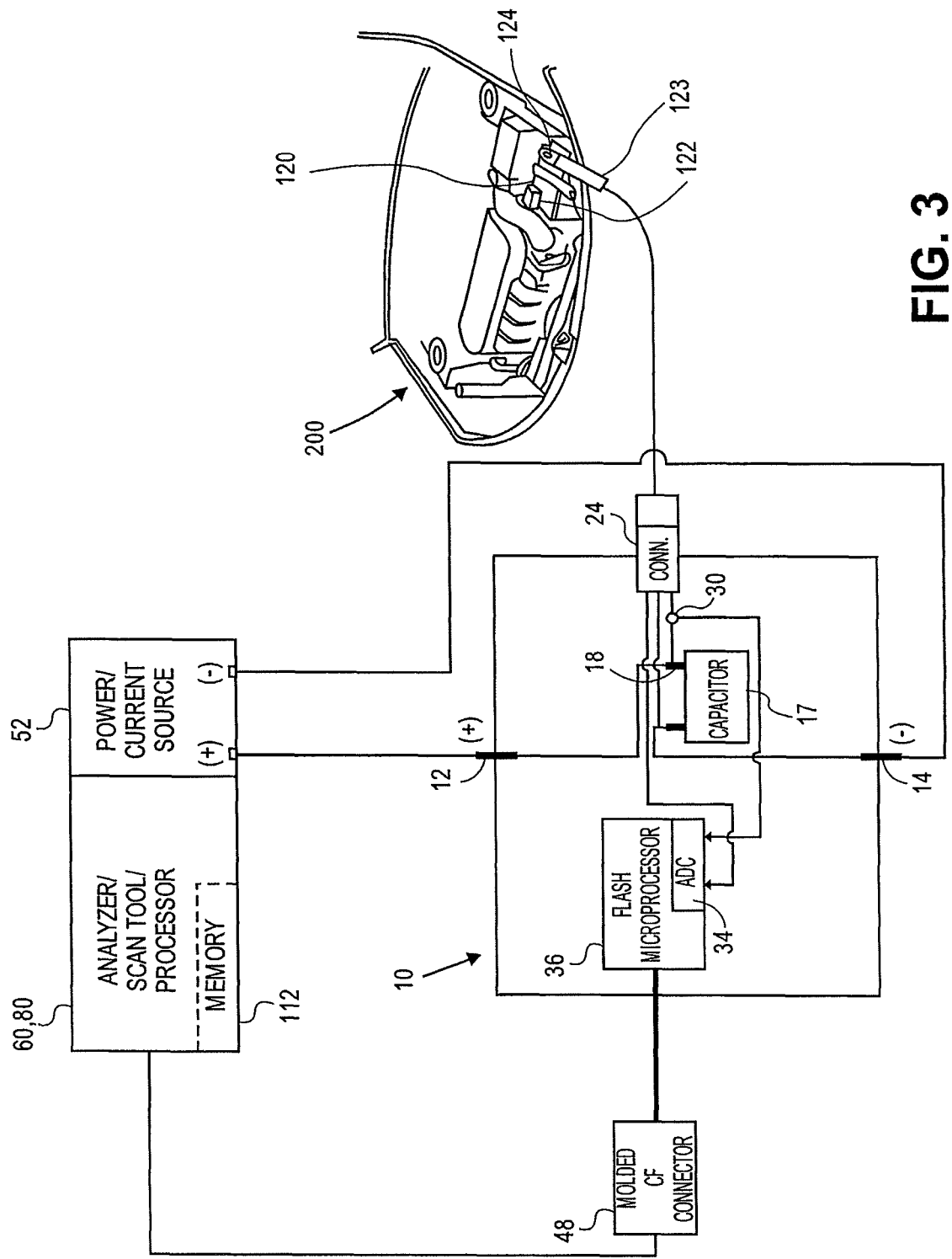
FIG. 3 is a schematic view of the battery charger adapter connected to the vehicle in an alternative embodiment.

Referring to FIGS. 1-3, a battery charger adapter for vehicle memory saving drain testing and starter current testing includes a parasitic drain tester (PDT) 100, which is a device used in conjunction with the battery service center (BSC) or analyzer 60 for the purpose of measuring vehicle parasitic battery drain and measuring the high current used by the vehicle starter motor. The parasitic drain tester 100 can also be used in conjunction with a diagnostic tool 80. The PDT 100 could be used with any battery tester with communication interface (e.g., molded CF connector 48), and processing capability to add software algorithms to operate the PDT 100.

The BSC 60 does not have a connection for the high current measuring clamp (e.g., High Amp Clamp (for starter tests) 42), or a serial communication device. Therefore, the PDT 100 connects to the BSC 60 for communication (receiving commands and sending measurement data). The PDT 100 receives its power from the BSC 60, by connecting the battery charging leads from the BSC to the positive (positive connector terminal 12) and negative (negative connector terminal 14) battery clamp connections on the PDT 100.

To use the PDT 100 with BSC 60 to measure vehicle parasitic battery drain and save vehicle system memory, a cigarette lighter plug 40 (for memory saver and battery drain tests), is connected to the PDT 100 at test connection member 24, and to the vehicle's cigarette lighter socket. With the memory saver and drain measurement mode selected on the BSC 60, the vehicle battery cable can be disconnected from the vehicle. Vehicle system memory is preserved, by the voltage and current supplied to the vehicle through the PDT 100, via the cigarette plug 40. The PDT 100 can measure the current required by the vehicle's systems with the vehicle ignition turned off, known as parasitic current. The user can monitor changes in the parasitic current on the BSC 60 (which receives the measurement data from the PDT 100) while removing fuses or disconnecting vehicle accessories.

Many battery chargers do not have a communication connection for devices like the PDT 100. However, many battery chargers have a memory card port for memory expansion or software updating. The PDT 100 can connect to the BSC 60 or similar device through this connection, using the molded CF connector 48. The connector is molded for ease of use and durability. Other connection means could also be made optional to enable the PDT 100 to connect to other types of communication interfaces.

To use the PDT 100 with the BSC 60 to measure the high current used by the vehicle starter motor, the BSC 60 is connected to the PDT 100 as described above (battery clamps to the battery posts and the molded CF connector 48 to the BSC 60 memory connection). The current measuring clamp ("high Amp Clamp", 42), is connected to the PDT 100 via connection 24. The clamp part 42d is placed around the positive or negative battery cable of the vehicle and connect with the contact portion 42e of the high amp clamp 42 with a body portion 42a. With the BSC 60 in the starter current measurement mode, the vehicle can be started and the PDT 100 will measure the current (usually between 100 to 300 amperes, for example) and send the measurement data to the BSC 60 for recording and in relaying to the user. This current can be used to determine a condition of the starter motor.

Referring back to FIG. 1, in a current measuring circuit 10 of the PDT 100, the positive battery camp connection 12 and the negative battery clamp connection 14 are connectors, similar to a battery post, connected to the respective positive and negative cables from a battery charging device, such as from the battery service center 60 so as to provide a voltage source, such as a 12 volt source to the current measuring circuit 10. The current measuring circuit 10 can include a capacitor 17, such as a 10,000 pf (micro farads) capacitor, to smooth out the power. Also, a parasitic load current sensor 30, such as a current shunt, is connected in series with the power connector 18 or power connection member and the Analog to Digital converter (ADC) 34, so that the ADC 34 can measure the current and the voltage and provide the information to a Flash Microprocessor 36, or other suitable processor. The Flash Microprocessor determines if the current, or voltage measured is within a predetermined range or ranges. If the measured current is not within the predetermined range, such as when the current exceeds the maximum current value, evidences that a problem is present due to the additional current drawn. By selectively connecting or disconnecting various circuits or systems of the vehicle, or apparatus, such as by selectively connecting or disconnecting one or more fuses for the corresponding circuits or systems.

Also, according to aspects of the invention, the current measuring device 10 in the parasitic drain tester 100 can record and determine the amount of current drawn by the vehicle 200 over time, such as measuring and recording the current drawn periodically or at predetermined times or intervals through the use of the microprocessor 36. For example, in some vehicles 200, an evaporative emissions test is typically performed after the engine has stopped running and the ignition key has been removed from the vehicle. According to aspects of the invention, the amount of current drawn by such emission test, or other post-shutdown functions of the vehicle, can be measured and recorded by the current measuring device 10 to determine if the test is conducted properly, as well as in the proper time frame. Therefore, the current measuring device 10 and methods of measuring current, according to aspects of the invention, can monitor what is occurring in the vehicle 200 by monitoring the current drain or current draw of the vehicle 200 over time. Determinations or analysis as to the current drain measured by the current measuring circuit 10, can be performed by the flash microprocessor 36, or other suitable processor, or can be communicated through the connector 24 to either the BSC 60 or the diagnostic tool 80 for storage or analysis.

The molded CF (compact flash) connector 48, such as a compact flash type interface, can provide a memory for storing information provided from the current measuring circuit 10. The connector 48 can also provide an input/output device or connector, such as to provide information on the measurements or analysis to the battery service center 60 or a diagnostic tool 80. Additionally, the connector 48 can provide information on the measurements or analysis to a central computer or center, such as by communicating over a phone connection, an aerial transmitter or over the Internet. The connection from the CF connector 48 can provide both power and ground signals along with a data signal. Other types of I/O interfaces can be used such as SD (secure digital) I/O (with input and output capabilities), or a universal serial bus that can be connected either directly to a memory source or used an interface for additional connection. The interface can also be a wireless connection such as BLUETOOTH or IEEE (Institute of Electrical and Electronic Engineers) 802.11x, but can include an additional line for power and ground.

The flash microprocessor 36 communicates with the CF connector 48, such as through a serial communication or communication interface, the interface providing a signal connection or communication path, such as to provide for power, ground and signal communication with, to or from CF connector 48. The connection from the flash microprocessor 36 to the battery service center 60 or diagnostic tool 80 can also be done through a parallel communication link.

Communicating with the flash microprocessor 36, or other suitable processing device, is a converting device, such as an analog to digital converter (ADC) 34, which can be part of the microprocessor 36, that converts received analog signals, such as analog voltage signals from current measurement, to a digital signal or digital data. The digital signal or digital data is then provided from the ADC 34 to the processing device, such as the flash microprocessor 36, which can perform further analysis, calculations or formatting of the data, or can also forward the digital signal or digital data from the serial connection interface to the CF connector 48. The flash microprocessor 36 is a reprogrammable microprocessor that allows the software to be upgraded or "flashed," thus allowing for expandability and avoiding future obsolescence. The flash microprocessor 36 can also include a separate internal memory or memory cache area to make the processing of repetitive functions more efficient and to hold certain data and programs for more efficient processing of the data. The CF connector 48 can then store or provide the digital signals or digital data to the battery service center 60, diagnostic tool 80, central computer, or the unit suitable for storage or analysis.

Referring to FIGS. 2 and 3, in the current measuring circuit 10, a connector or connection member 24 is provided for connection with a power connector 40, such as a cigarette lighter receptacle of vehicle 200. Where the current measuring circuit 10 functions as a measuring device for measuring parasitic current drain, the cigarette lighter plug 40 has a connector or connection member 40c at one end to engage with the connection member 24 of the current measuring circuit 10 and has a connection member 40a at the other end to engage with a cigarette lighter receptacle or a power source connection member, such as a clip 123, with the power source receptacle 124 of vehicle 200. With the current measuring circuit 10 engaged with the vehicle through the connector 24, via the cable to the cigarette lighter receptacle or power source receptacle 124, power can be provided from a power source, such as from the battery service center 60 or other suitable power source, through the current measuring circuit 10 to the vehicle 200. By providing power to the vehicle 200 from the power source through the current measuring circuit 10, it saves the device memory and minimizes or reduces drain on the internal power source or internal battery that would have typically been used to maintain power to the memories of the devices, such as radio settings for a vehicle radio, where the vehicle apparatus main power source, such as where a vehicle battery 120 is disconnected.

The power current source for the current measuring circuit can be provided through the power/current source 52 of the battery service center 60 or a separate unit in conjunction with a diagnostic tool 80. The battery service center 60 can include a memory 112 for processing and storing of the information.

Figure 4:
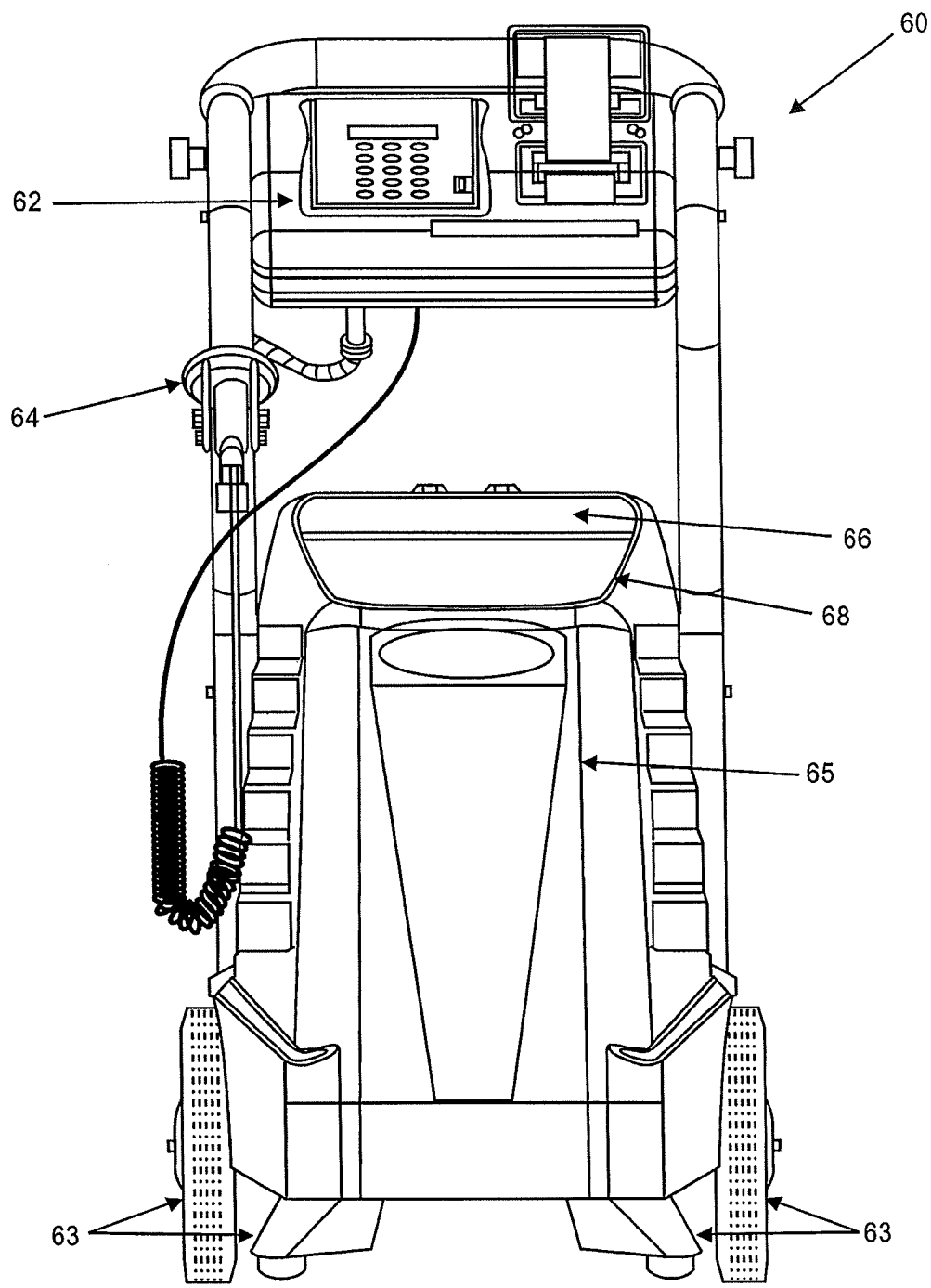
FIG. 4 is a prospective view of an analyzer including a battery service station.

An embodiment of the battery service center 60 used with the current measuring circuit 10 is illustrated in FIG. 4. The battery service center 60 includes a control panel 62 for controlling the battery service center 60, a bar code scanner 64 for input of additional information, an auxiliary battery area 66 for storage of an optional battery, a storage tray 68 for placement of miscellaneous tools, outer housing 65 for protection of the internal components and wheels and support legs 63 for mobility of the battery service center 60.

Figure 5:
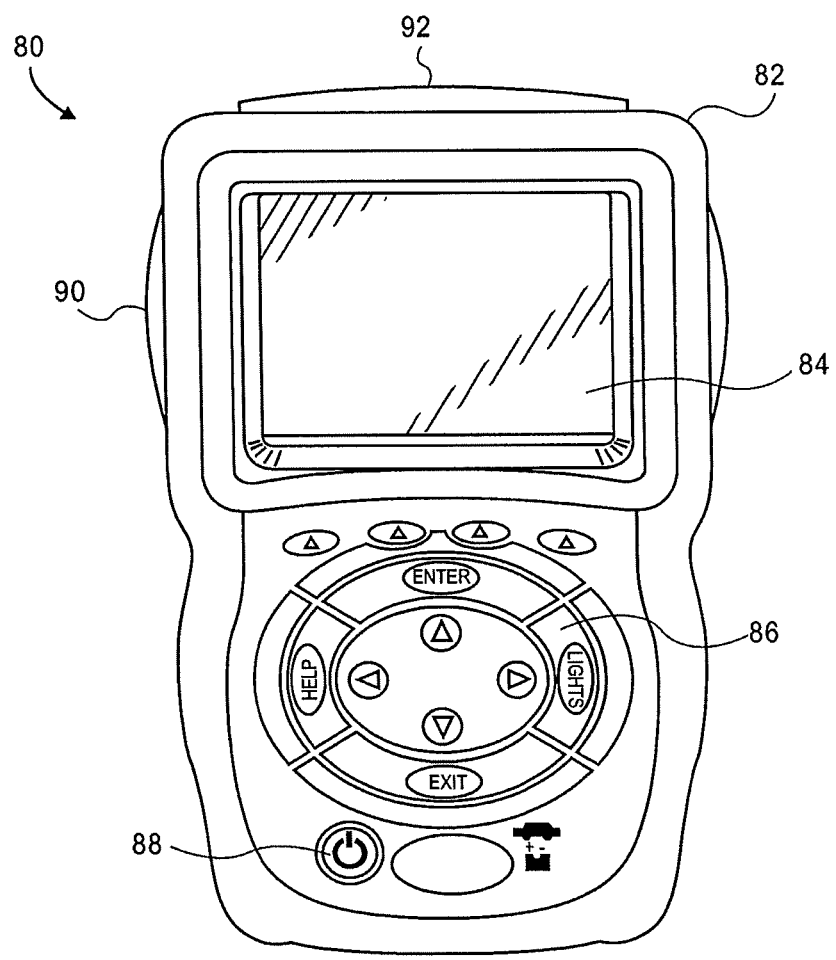
FIG. 5 is a front view of a diagnostic tool.

An embodiment of the diagnostic tool 80 used with the current measuring circuit 10 is illustrated in FIG. 5. In particular, FIG. 5 is a front view illustrating a diagnostic tool 80 according to an embodiment of the invention. The diagnostic tool 80 can be any computing device, for example, the NEMI- SYS diagnostic tool from SERVICE SOLUTIONS (part of the SPX Corporation). The diagnostic tool 80 includes a housing 82 to encase the various components of the diagnostic tool 80, such as a display 84, a user interface 86, a power button 88, a memory card reader 90 and a connector interface 92. The display 84 can be any type display, including for example but not limited to, a liquid crystal display (LCD), organic light emitting diode (OLED), field emission display (FED), electroluminescent display (ELD), etc. In addition, the LCD, for example, can be touch screen that both displays and performs the additional task of interfacing between the user and the diagnostic tool 80. The user interface 86 allows the user to interact with the diagnostic tool 80, in order to operate the diagnostic tool as the user prefers. The user interface 86 can include function keys, arrow keys or any other type of keys that can manipulate the diagnostic tool 80 in order to operate the diagnostic tool through the software. The user interface or input device 86 can also be a mouse or any other suitable input device for the user interface 86, including a keypad, touchpad, etc. The user interface 86 can also include keys correlating to numbers or alphanumeric characters. Moreover, as mentioned above, when the display 84 is touch sensitive, the display 84 can supplement or even substitute for the user interface 86. The power key or button 88 allows the user to turn the power to the diagnostic tool 80 on and off, as required.

A memory card reader 90 can be a single type card reader, such as, but not limited to, a compact flash card, floppy disk, memory stick, secure digital, flash memory or other type of memory. The memory card reader 90 can be a reader that reads more than one of the aforementioned memory such as a combination memory card reader. Additionally, the card reader 90 can also read any other computer readable medium, such as CD (compact disc), DVD (digital video or versatile disc), etc.

The connector interface 92 allows the diagnostic tool 80 to connect to an external device, such as, but not limited to, an ECU (electronic control unit) of a vehicle, a computing device, an external communication device (such as a modem), a network, etc. through a wired or wireless connection. Connector interface 92 can also include connections such as a USB (universal serial bus), FIREWIRE (Institute of Electrical and Electronics Engineers (IEEE) 1394), modem, RS232, RS48J, and other connections to communicate with external devices, such as a hard drive, USB drive, CD player, DVD player, or other computer readable medium devices.

Figure 6:
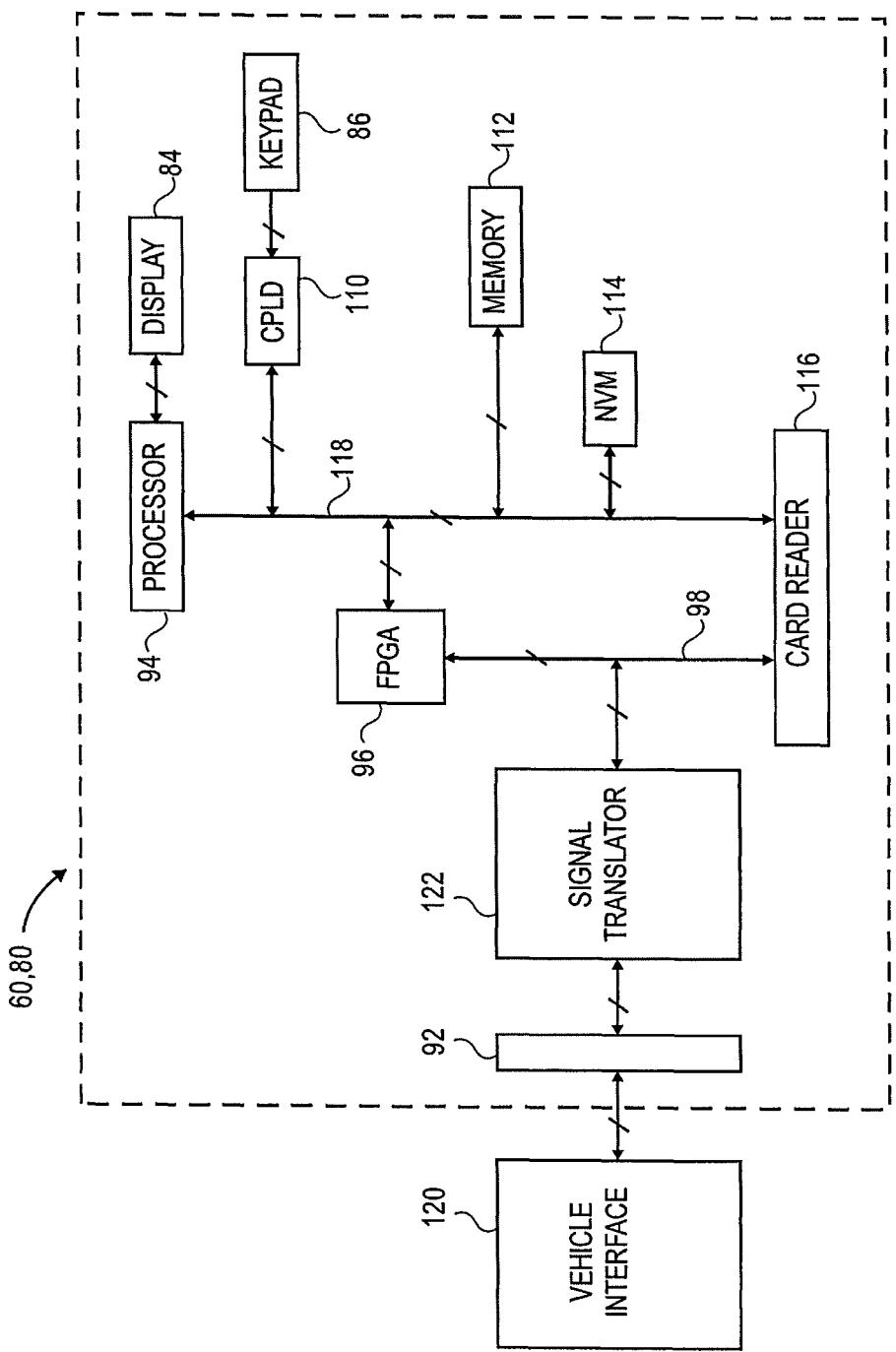
FIG. 6 is a schematic view of the diagnostic tool of FIG. 5.

FIG. 6 is a block diagram of the components of the diagnostic tool 80. In FIG. 6, the diagnostic tool 80, includes a processor 94, a field programmable gate array (FPGA) 96, a first system bus 98, the display 84, a complex programmable logic device (CPLD) 110, the user interface 86 in the form of a keypad, a memory subsystem 112, an internal non-volatile memory (NVM) 114, a card reader 116, a second system bus 118, the connector interface 92, and a selectable signal translator 122. A vehicle communication interface 120 is in communication with the diagnostic tool 80 through connector interface 92 via an external cable. The connection between the vehicle communication interface 120 and the connector interface 92 can also be a wireless connection such as BLUETOOTH, infrared device, wireless fidelity (WiFi, e.g. 802.11), etc.

The selectable signal translator 122 communicates with the vehicle communication interface 120 through the connector interface 92. The signal translator 122 conditions signals received from a motor vehicle control unit through the vehicle communication interface 120 to a conditioned signal compatible with the diagnostic tool 60, 80. The translator 122 can communicate with, for example, the communication protocols of J1850 signal, ISO 9141-2 signal, communication collision detection (CCD) (e.g., Chrysler collision detection), data communication links (DCL), serial communication interface (SCI), S/F codes, a solenoid drive, J1708, RS232, controller area network (CAN), or other communication protocols that are implemented in a vehicle.

The circuitry to translate a particular communication protocol can be selected by the FPGA 96 (e.g., by tri-stating unused transceivers) or by providing a keying device that plugs into the connector interface 92 that is provided by diagnostic tool 80 to connect the diagnostic tool 80 to vehicle communication interface 120.

Translator 122 is also coupled to FPGA 96 and the card reader 116 via the first system bus 98. FPGA 96 transmits to and receives signals (i.e., messages) from the motor vehicle control unit through the translator 122.

FPGA 96 is coupled to the processor 94 through various address, data and control lines by the second system bus 118. FPGA 96 is also coupled to the card reader 116 through the first system bus 98. Processor 94 is also coupled to the display 84 in order to output the desired information to the user. The processor 94 communicates with the CPLD 110 through the second system bus 118. Additionally, the processor 94 is programmed to receive input from the user through the user interface 86 via the CPLD 110. The CPLD 110 provides logic for decoding various inputs from the user of diagnostic tool 80 and also provides the glue-logic for various other interfacing tasks.

Memory subsystem 112 and internal non-volatile memory 114 are coupled to the second system bus 118, which allows for communication with the processor 94 and FPGA 96. Memory subsystem 112 can include an application dependent amount of dynamic random access memory (DRAM), a hard drive, and/or read only memory (ROM). Software to run the diagnostic tool 80 can be stored in the memory subsystem 112. The internal non-volatile memory 114 can be, but not limited to, an electrically erasable programmable read-only memory (EEPROM), flash ROM, or other similar memory. The internal non-volatile memory 114 can provide, for example, storage for boot code, self-diagnostics, various drivers and space for FPGA images, if desired. If less than all of the modules are implemented in FPGA 96, the non-volatile memory 114 can contain downloadable images so that FPGA 96 can be reconfigured for a different group of communication protocols.

The present invention can be realized as computer-executable instructions in computer-readable media. The computer-readable media includes all possible kinds of media in which computer-readable data is stored or included or can include any type of data that can be read by a computer or a processing unit. The computer-readable media include for example and not limited to storing media, such as magnetic storing media (e.g., ROMs, floppy disks, hard disk, and the like), optical reading media (e.g., CD-ROMs (compact disc-read-only memory), DVDs (digital versatile discs), re-writable versions of the optical discs, and the like), hybrid magnetic optical disks, organic disks, system memory (read-only memory, random access memory), non-volatile memory such as flash memory or any other volatile or non-volatile memory, other semiconductor media, electronic media, electromagnetic media, infrared, and other communication media such as carrier waves (e.g., transmission via the Internet or another computer). Communication media generally embodies computer-readable instructions, data structures, program modules or other data in a modulated signal such as the carrier waves or other transportable mechanism including any information delivery media. Computer-readable media such as communication media may include wireless media such as radio frequency, infrared microwaves, and wired media such as a wired network. Also, the computer-readable media can store and execute computer-readable codes that are distributed in computers connected via a network. The computer readable medium also includes cooperating or interconnected computer readable media that are in the processing system or are distributed among multiple processing systems that may be local or remote to the processing system. The present invention can include the computer-readable medium having stored thereon a data structure including a plurality of fields containing data representing the techniques of the present invention.

An example of a computer, but not limited to this example of the computer, that can read computer readable media that include computer-executable instructions of the present invention includes a processor that controls the computer. The processor uses the system memory and a computer readable memory device that includes certain computer readable recording media. A system bus connects the processor to a network interface, modem or other interface that accommodates a connection to another computer or network such as the Internet. The system bus may also include an input and output interface that accommodates connection to a variety of other devices.

Although an example of the apparatus for monitoring battery drain and starter current with the above components and connected to vehicle as shown above, it will be appreciated that other techniques for monitoring battery drain and starter current can be made. Also, although the apparatus for monitoring battery drain and starter current can be used with a diagnostic tool, other configurations and device can also be used including a personal computer or other device.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A current measuring system, comprising:
means for measuring current, comprising:
  means for smoothing a current distribution within the means for measuring current;
  first means for interfacing to a vehicle power source being tested;
  second means for interfacing to means for diagnosing a vehicle;
  means for converting connected to the first means for interfacing to the vehicle power source, the means for converting being configured to convert a signal received from the first means for interfacing with the vehicle power source from a first form to a second form, wherein the means for measuring current is configured to provide data about a parasitic battery drain of the vehicle and a high current used by a starter motor of the vehicle; and
  first means for processing connected to the means for converting, the first means for processing being configured to receive and analyze data converted by the means for converting;
means for diagnosing the vehicle based on data received from the means for measuring current, the means for diagnosing the vehicle comprising:
  means for storing the data received from the means for measuring current; and
  second processing means for analyzing the data received from the means for measuring current and for providing instructions to the first means for processing for analysis of a current drain of the vehicle; and
a power source controlled by the means for diagnosing the vehicle and configured to power the means for diagnosing the vehicle and the means for measuring current.

2. The system of claim 1, wherein the means for measuring current is connected directly to the vehicle power source.

3. The system of claim 1, wherein the means for measuring current is connected to the vehicle power source indirectly through an internal connection within the vehicle.

4. The system of claim 1, wherein the first means for processing is a flash processor that is reprogrammable through software, and the means for converting is integral with the first means for processing.

5. The system of claim 1, wherein the means for diagnosing is a battery service center, a diagnostic tool, or a personal computer.

* * * * *